United States Patent [19]

Kramer et al.

[11] Patent Number: 4,616,182

[45] Date of Patent: Oct. 7, 1986

[54] NUCLEAR MAGNETIC RESONANCE SIGNAL ARTIFACT REMOVAL

[75] Inventors: David M. Kramer, Cleveland Heights; Hong-Ning Yeung, Richmond Heights, both of Ohio

[73] Assignee: Technicare Corporation, Solon, Ohio

[21] Appl. No.: 550,522

[22] Filed: Nov. 9, 1983

[51] Int. Cl.[4] ............................................. G01V 29/3
[52] U.S. Cl. .................................................. 324/309
[58] Field of Search ............... 324/307, 309, 310, 311, 324/313, 314

[56] References Cited

U.S. PATENT DOCUMENTS 4,301,410 11/1981 Wind ................................... 324/307
4,318,043 3/1982 Crooks ............................... 324/309

OTHER PUBLICATIONS

"Suppression of Artifacts in Two Dimensional J Spectroscopy" by Bodenhausen et Alia, Journal of Magnetic Resonance (1977) pp. 511-514.

Primary Examiner—Reinhard J. Eisenzopf
Assistant Examiner—G. Peterkin
Attorney, Agent, or Firm—W. Brinton Yorks, Jr.

[57] ABSTRACT

In an NMR imaging system, two-pulse excitation sequences are used to acquire lines of NMR signal information. Artifact signal components may also be present during the times of NMR signal acquisition. In order to remove these artifacts from the center of the image, the artifact signals are alternately phase-encoded from line to line by alternating the phase of one of said excitation pulses from line to line. Fourier transformation is performed on the lines of information in at least the direction of alternate phasing of the artifact components, which relocates the artifacts to the edge of the resulting image.

11 Claims, 9 Drawing Figures

NUCLEAR MAGNETIC RESONANCE SIGNAL ARTIFACT REMOVAL

This invention relates to techniques for removing unwanted artifact signal components from nuclear magnetic resonance (NMR) signals and, in particular, to techniques for artifact removal in NMR imaging systems through control of the phase relationships of radio frequency (r.f.) pulses in an NMR excitation sequence prior to Fourier transformation.

The NMR technique may be used to form images of several characteristics of cellular and other materials. The object to be imaged is placed in a static magnetic field, whereby atomic nuclei align themselves with the static field. This field is disturbed in a controlled manner by excitation signals from a radio frequency coil, disturbing the nuclei from their equilibrium alignment. When the disturbing signals are removed, the nuclei begin to assume their original alignment, and emit energy in the process. The emitted signals are detected by the transmitting r.f. coil, or by another dedicated receiving r.f. coil. The signals are spatially encoded with magnetic field gradients. The detected signals are then processed to produce an image, typically of a plane or planes of the object being imaged.

Ideally, detected NMR signals should contain only specific information relating to the characteristics of the material being imaged, uncontaminated by spurious signal components. Numerous efforts have been directed toward this goal. For instance, in the case of one dimensional pulse-Fourier transform NMR signals, an unwanted steady-state-free-precession type of refocussing can build up at the end of a desired free induction decay experiment. One approach toward eliminating this build-up is variation of the interpulse delay between excitation pulses.

In two- and three-dimensional NMR imaging, approaches to enhanced resolution become more involved due to the presence of additional signals necessary for spatial resolution. In order to resolve specific locations in a plane of material, the material is subjected to time-varying and space-varying magnetic fields. The gradients (G) are generally linearly varying fields over the image volume. Spatial resolution in the x direction may be improved, for instance, by increasing the slope of the $G_x$ field across the image. The increased spatial resolution in the x direction is accompanied by a corresponding reduction in the signal-to-noise ratio of the received signals, however, due to the wider bandwidth necessary to detect the broader range of NMR signal frequencies.

A second technique for improving resolution is to increase the time window during which the NMR signal is sampled. By gathering more information in the time domain, a greater spectral resolution is available for Fourier transform processing, resulting in greater spectral resolution in the spatial representation of the NMR signals.

In the time domain, two types of NMR signals can be produced. One type is the free induction signal, an r.f. signal emitted immediately following a single r.f. excitation pulse. The second type of NMR signal is the multiple pulse response, of which the spin-echo signal is an example. Spin-echo signals may be induced, for instance, by tipping the bulk magnetization to the (x-y) plane with a 90° excitation pulse. Following the 90° pulse, a second, 180° pulse is applied, and the components of magnetization begin to refocus in the (x-y) plane and regain phase coherence momentarily. As they rephase, a spin-echo signal is developed. The emitted spin-echo signal resembles back-to-back free induction signals, with a signal peak occurring after the second r.f. pulse at a time equal to the time separation of the two r.f. pulses.

Unlike the free induction signal, the sampling window for the spin echo signal may be adjusted in both directions (in time) relative to the signal peak. However, as the sampling window is extended back in time toward the second excitation pulse, free induction signal components generated from each of the two pulses individually, but primarily the second r.f. pulse are also present. These unwanted components are caused by r.f. magnetic field inhomogeneities, or by tip angle missettings. A perfect 180° pulse causes no free induction decay signal; however, it is not always possible to generate a perfect pulse. When these unwanted signal components are gathered and processed, they manifest themselves as artifacts through the NMR image. Accordingly, it is desirable to be able to widen the sampling window for the NMR signal to improve image resolution without artifacts from free induction decay signal components.

A technique for eliminating such artifacts in NMR spectroscopy is described in the article "Suppression of Artifacts in Two-Dimensional J Spectroscopy", by G. Bodenhausen, et al., published in the Journal of Magnetic Resonance 2, pp. 511–514 (1977). In the technique there described, the phase of the second excitation pulse, the phase of the receiver reference signal, or preferably both, are alternated over a number of different data acquisitions. The data recovered from the different acquisitions, preferably four in number, is summed, resulting in coherent addition of spin-echoes and phase cancellation of artifacts.

The foregoing technique requires that as many as four excitation pulse sequences of two pulses each be performed in order to provide for proper constructive reinforcement and cancellation. In NMR imaging, the time required to perform four sequences may be insubstantial for scans of small areas, but the aggregate time allocation may be significant when performing scans of large areas or three dimensions. This is due to the physical principles inherent in NMR imaging. After each two-pulse sequence, time must be allotted for the disturbed spin system to relax. The allocated time for relaxation is governed by the immutable spin-spin and spin-lattice relaxation time constants. Hence, the use of this NMR spectroscopy technique for artifact cancellation would impose a severe time constraint in NMR imaging.

In accordance with the principles of the present invention, a technique is provided for eliminating artifacts in NMR imaging during image reconstruction from a single data acquisition. Lines within a data set are scanned, with the phase of an excitation pulse or the phase of the receiver reference signal or both alternated from line to line. The time domain signal information is then processed by Fourier transformation. The imposition of the proper phase of the excitation pulses or reference signals provides the artifact components with a rapid phase alternative which, in the process of Fourier transformation, results in their reconstruction at the edge of the image. The artifacts are thus located away from the center of the image, which is generally the image area of greatest interest.

In accordance with the principles of a preferred embodiment of the present invention, the artifact components are made to alternate phase coherently by alternation of the phase of a r.f. excitation signal. The desired spin-echo signals possess no such alternation. A two- or three-dimensional Fourier transformation is then performed with respect to the direction of this alternation, resulting in the reconstruction of the phase coherent artifact components at the edge of the image.

Figure 1:
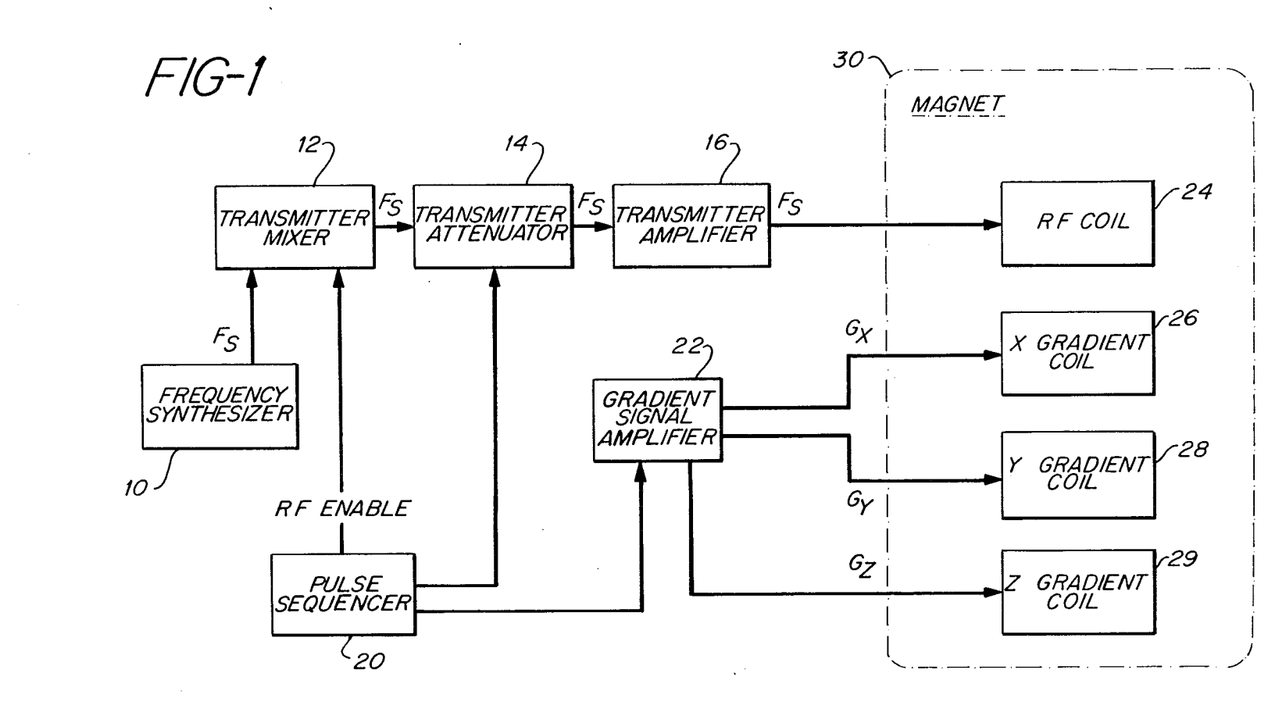
FIG. 1 illustrates in block diagram form the transmission portion of an NMR imaging system.

Referring to FIG. 1, the transmission portion of an NMR imaging system is shown. A transmitter mixer 12 receives a signal $F_s$, where $F_s$ is the transmitted radio frequency NMR signal, from a frequency synthesizer 10. The $F_s$ signal is heterodyned by the mixer to produce the $F_s$ signal, which is coupled by way of a controlled transmitter attenuator 14 to a transmitter amplifier 16. The transmitter mixer 12 and attenuator 14 are controlled by control signals provided by a pulse sequencer 20, which applies an r.f. enable signal to the mixer 12. The $F_s$ signal is amplified by the amplifier 16 and applied to the r.f. coil 24 in the magnet 30 in the form of a sequence of pulses formed under control of the pulse sequencer 20. The r.f. coil 24 applies the $F_s$ pulses to the subject being imaged.

Also located within the field of the magnet 30 are x, y, and z gradient coils 26, 28, and 29. These coils receive gradient control signals $G_x$, $G_y$, and $G_z$ from gradient signal amplifiers 22. The control signals are produced by the pulse sequencer 20.

Figure 2:
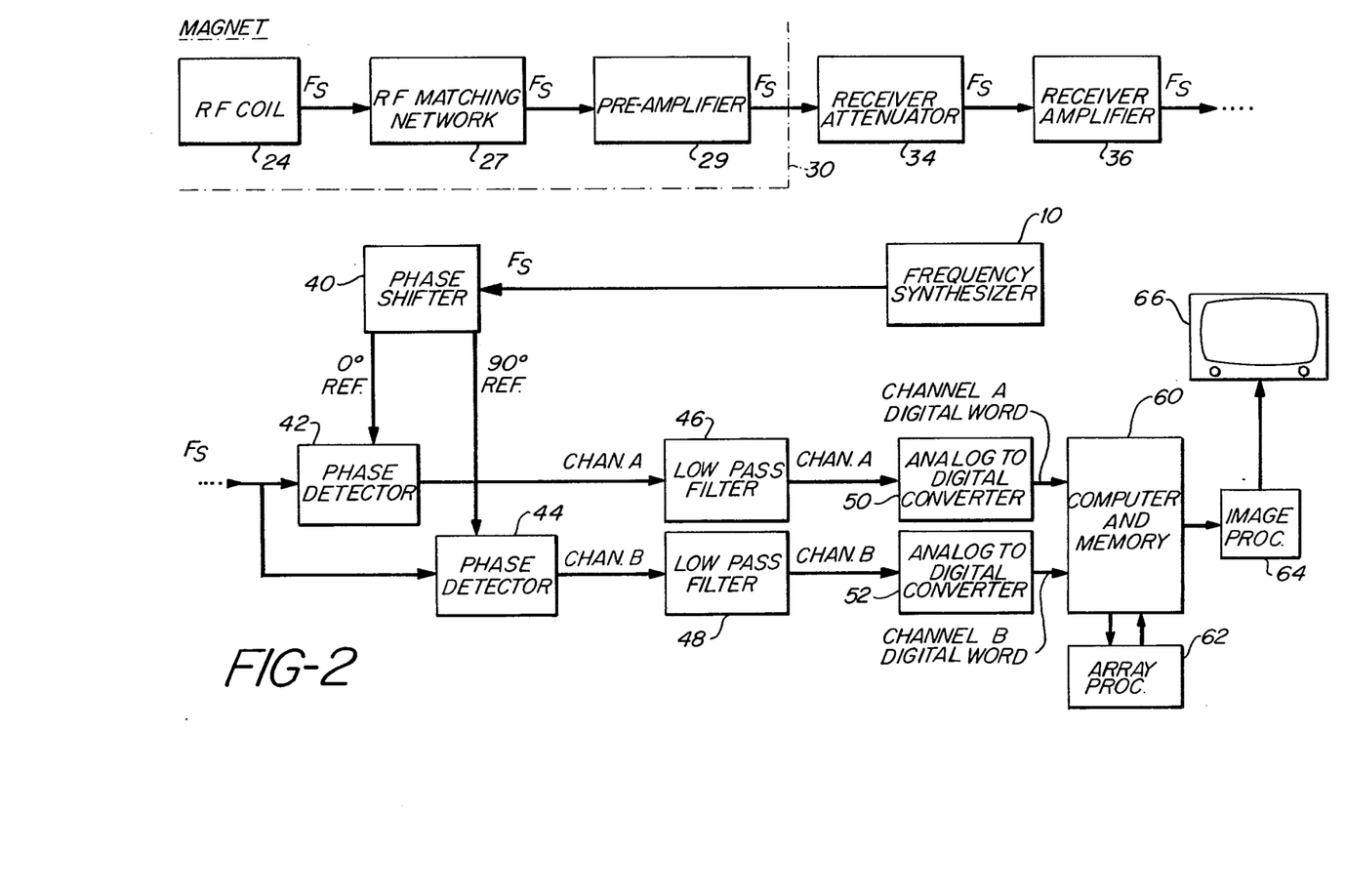
FIG. 2 illustrates in block diagram form the receiver portion of an NMR imaging system.

The NMR signals emitted by the nuclei of the material being imaged induce $F_s$ return signals in the r.f. coil 24. These return signals are coupled by way of an r.f. matching network 27 to a pre-amplifier 29', and on to a receiver attenuator 34 as shown in FIG. 2. The received $F_s$ signals are amplified by an amplifier 36 and applied to quadrature phase detectors 42 and 44. The phase detectors receive two phase demodulating signals at respective 0° and 90° phase angles from a phase shifter 40, which receives an $F_s$ reference signal from the frequency synthesizer 10. The phase detectors 42 and 44 produce a channel A and a channel B signal, respectively. The baseband A and B signals are filtered by respective low pass filters 46 and 48, and the filtered signals are then sampled by respective analog to digital converters 50 and 52. The resultant channel A and channel B digital words are stored in a the memory of a computer 60. The channel A and B digital words are then combined and transformed to the frequency domain by a Fourier transform array processor 62. The resultant image signals are assembled in an image format by an image processor 64, and the processed image is displayed on a video monitor 66.

Figure 3:
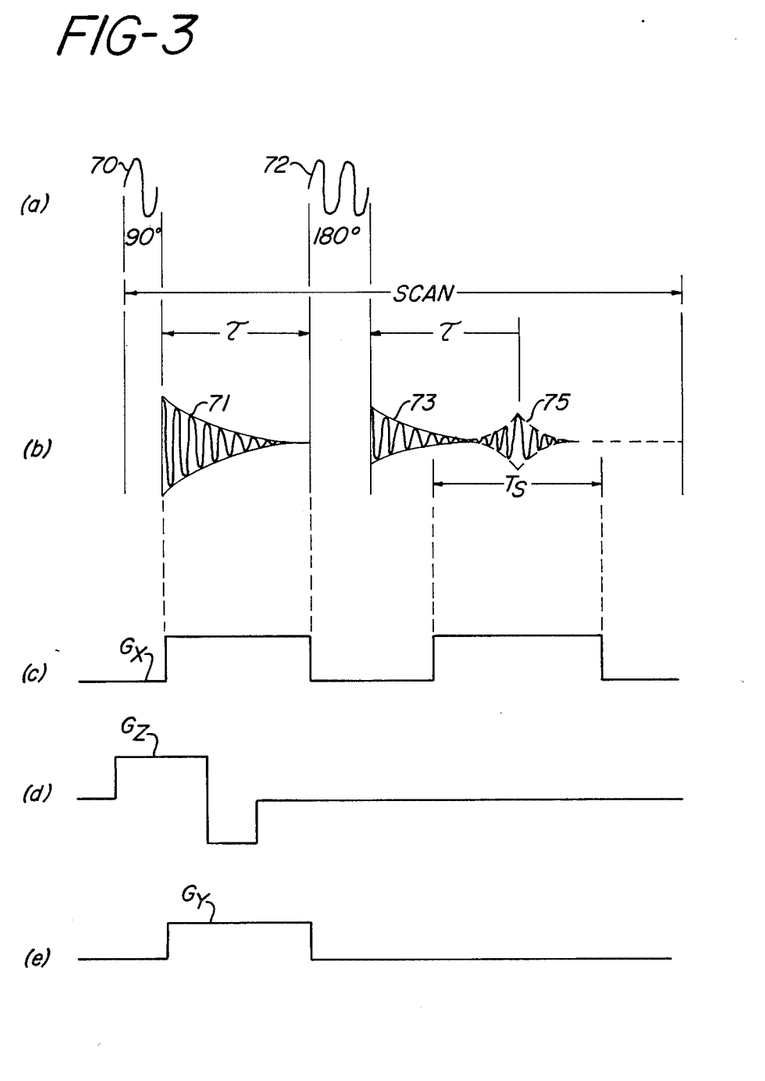
FIG. 3 illustrates excitation pulse, gradient signal, and NMR signal waveforms.

Referring to FIG. 3, the scan line there shown includes the two pulse sequence of a 90 degree pulse 70 and a 180 degree pulse 72. Free decay signals 71 and 73 follow the respective excitation pulses, and the desired spin-echo signal 75 is shown occurring during a sampling period $T_s$. For spatial identity of the recovered signals, gradient coils 26, 28 and 29 of FIG. 1 are energized by gradient pulses $G_x$, $G_y$ and $G_z$ as shown in FIG. 3. The $G_x$ gradient pulse is applied following the 90 degree excitation pulse and during the time of acquisition of the spin-echo signal 75. The $G_z$ gradient pulse is applied during the first excitation pulse period to spatially identify the (x-y) plane which is to be imaged. The $G_y$ gradient pulse is applied during the interval between the two excitation pulses to impose a spatially encoded phase factor onto the signal.

In the arrangement of FIG. 1, the nuclei of the material being imaged are excited by two-pulse sequences in accordance with the principles of the present invention, causing them to emit NMR signals in the form of spin echoes. Each two pulse sequence is comprised of an $\alpha°$ pulse and a following $\beta°$ pulse, after which a spin echo signal is generated by the nuclei and detected by the r.f. coil. In a preferred embodiment the $\alpha°$ pulse is a 90 degree pulse and the $\beta°$ pulse is a 180 degree pulse as shown in the scanning sequences of FIG. 4. In the line n sequence, a 90 degree pulse 70 is transmitted followed by a relaxation period $\tau$. During the relaxation period a free induction signal 71 is produced by the material being imaged, a signal which is not read by the receiver circuitry. At the end of the relaxation period $\tau$ a 180 degree pulse 72 is transmitted which exhibits a phase $\phi$. Ideally the 180 degree pulse should cause the bulk magnetization of the material being imaged to refocus in a direction opposite to that in which it was first "tipped" in the transverse (x-y) plane. However, due to inhomogeneities in the r.f. magnetic field at the location of the nuclei and tip angle missettings, an additional free decay signal 73 develops immediately following the end of the 180 degree pulse 72. The signal 73 rapidly decays, and is succeeded by the desired spin echo signal 75 as the bulk magnetization refocuses in the (x-y) plane. The spin-echo signal 75 peaks around a time $\tau$ following the 180 degree pulse, and is detected and sampled during sampling period $T_s$.

Figure 4:
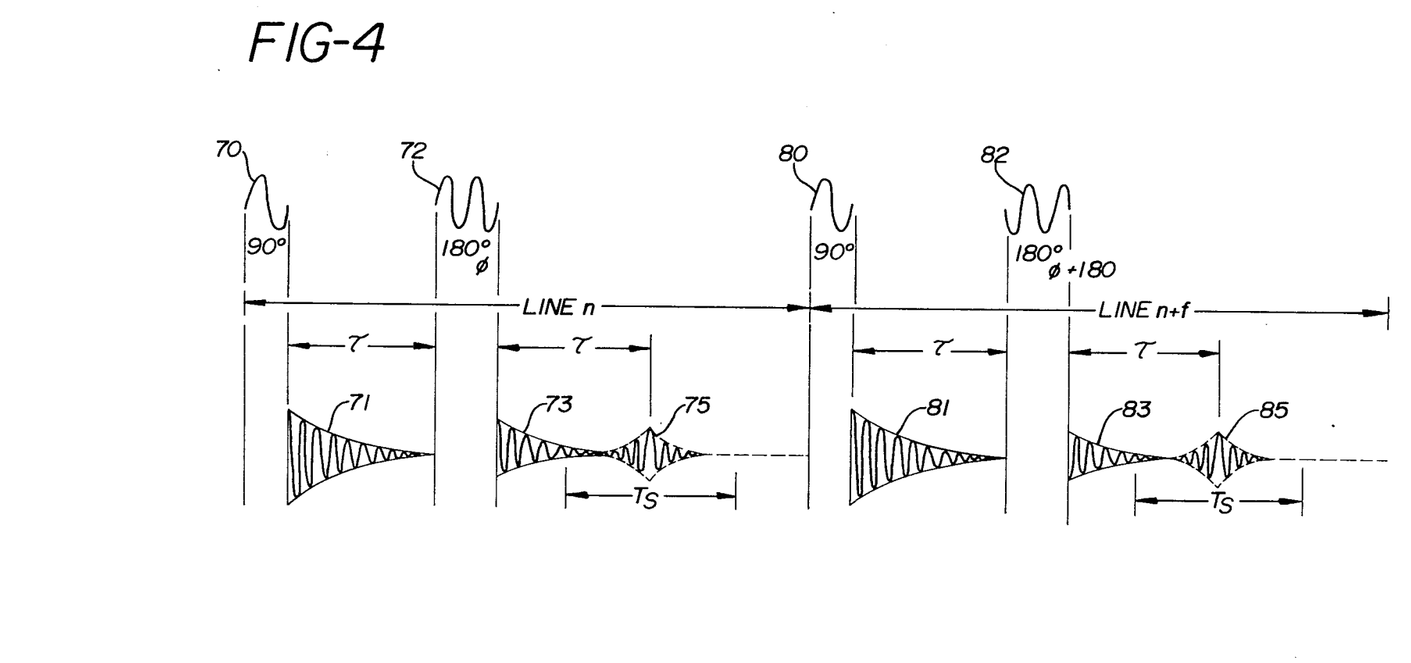
FIG. 4 illustrates waveforms depicting NMR system operation when the phase of a 180° pulse is alternated from line to line.

Although it is possible to detect and sample the spin-echo signal during the entire period following the 180 degree pulse 72, it has been found that such sampling will be adversely affected by the free induction decay signal 73 following the 180 degree pulse 72. Extending the sampling period later in time results in signal acquisition at a time when the spin echo signal is greatly diminished due to $T_2$ decay, or spin-spin relaxation. To avoid extending the sampling period to an earlier point in time, a steeper gradient magnetic field and increased bandwidth are generally used for signal detection. The increased bandwidth over a fixed number of resolved picture elements results in increased noise per image element. The present inventors have found that favotable signal-to-noise conditions are attained by setting the sampling period duration $T_s$ at least equal to the time $\tau$, and setting $\tau$ equal to $T_2/4$ for the $T_2$ relaxation characteristic of the material being imaged. The sampling period $T_s$ is centered in time around the time of occurrance of the spin-echo signal peak.

After the line n sequence a second scanning sequence for line n+1 is performed. The line n+1 sequence differs from the line n sequence in that the 180 degree pulse 82 exhibits a phase of $\phi+180°$, in phase opposition to that of the preceding 180 degree pulse 72. The generated spin-echo signal 85 is detected and sampled during the $T_s$ sampling period of the line n+1 sequence. The desired spin-echo signal is unaffected by the different phasing of the 180 degree pulse 82. However, the unwanted free induction decay signal 83 has been phase-shifted by 180 degrees in comparison to the previous free induction decay signal 73.

The detected spin-echo signals over a plurality of scan lines are sampled by the analog to digital converters 50 and 52 in FIG. 2, which produces signal information in the form of discrete digital words. These digital words, A and B, are arranged in a matrix array of complex numbers of the form $A_j(t)+iB_j(t)$, where t references the time of sampling during the sampling interval $T_s$, and j refers to line numbers. A Fourier transformation is then performed to convert the time domain data to a spatially representative frequency domain using Fourier transformation.

Figure 5A:
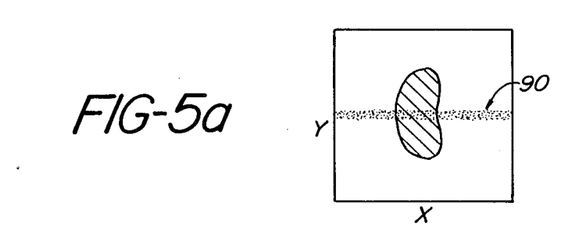
FIGS. 5a and 5b illustrate the effect of artifact relocation in accordance with the principles of the present invention.
Figure 5B:
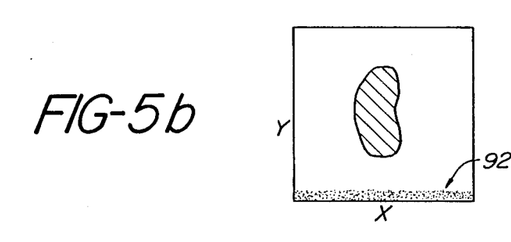

The result of the alternate phasing of the 180 degree pulses 72 and 82 is to alternately phase encode the artifact signals 73 and 83. Without this phase encoding, the portions of the artifact signals occurring during the sample time $T_s$ would have no phase modulation, as they are induced at a time when there is no $G_y$ pulse. In the process of Fourier transformation the randomly phased artifacts would manifest themselves as a distribution of signals about the zero frequency value in the center of the image in the y-direction, as indicated by the artifacts 90 in FIG. 5a. However, when the phase of the artifact components alternates by 180 degrees from line to line, the artifacts will manifest themselves as components located in the frequency spectrum at the limit of that employed in the Fourier transformation process, which causes them to appear at the edge of the image as shown by artifacts 92 in FIG. 5b. The artifacts are thus removed from the center of the image, which is generally the region of primary interest.

Figure 6:
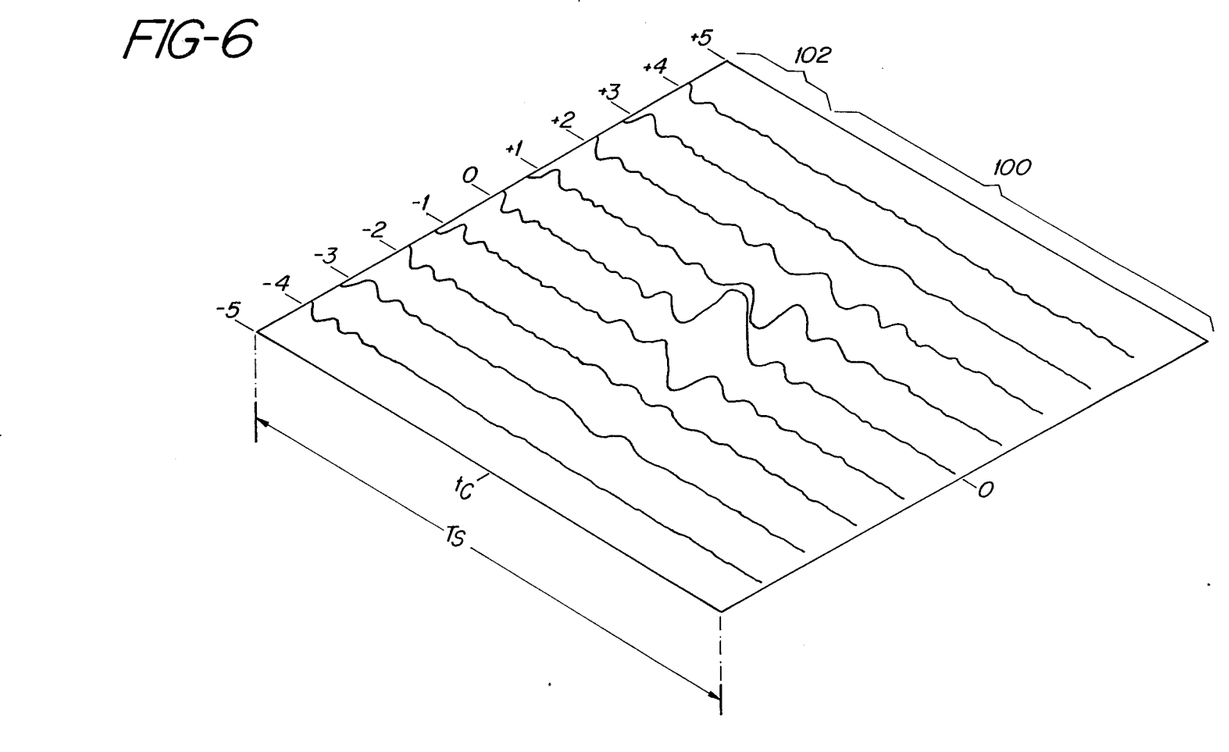
FIG. 6 shows raw data waveforms in the time domain prior to Fourier transformation.

The effect of Fourier transformation is representatively illustrated in FIG. 6, which depicts a plane of raw data before Fourier transformation. The spin-echo signals for the various lines of data are shown as a group of generally harmonically related waveforms 100, each having a center along the time axis at $t_c$. At the left hand side of the time axis and along the edge of the $G_y$ axis are the undesired free decay artifact signals 102. It is seen that, from line to line, the phasing of the artifact signals alternates at the same respective time location on each line. When Fourier transformation is performed with respect to $G_y$, the phase alternation at the line rate encodes the artifacts by this frequency dependence, resulting in the appearance of the artifacts at the boundary of the Fourier transformed image plane. The artifacts are thereby removed from the center and other disadvantageous locations in the final image.

Figure 7:
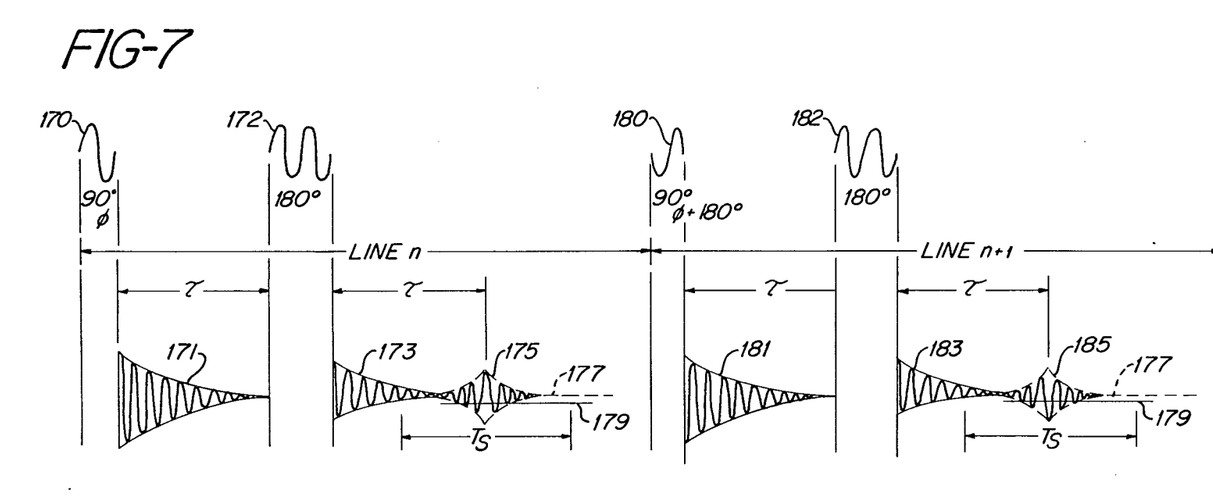
FIG. 7 illustrates wareforms depicting NMR system operation when the phase of a 90° pulse is alternated from line to line.
Figure 8:
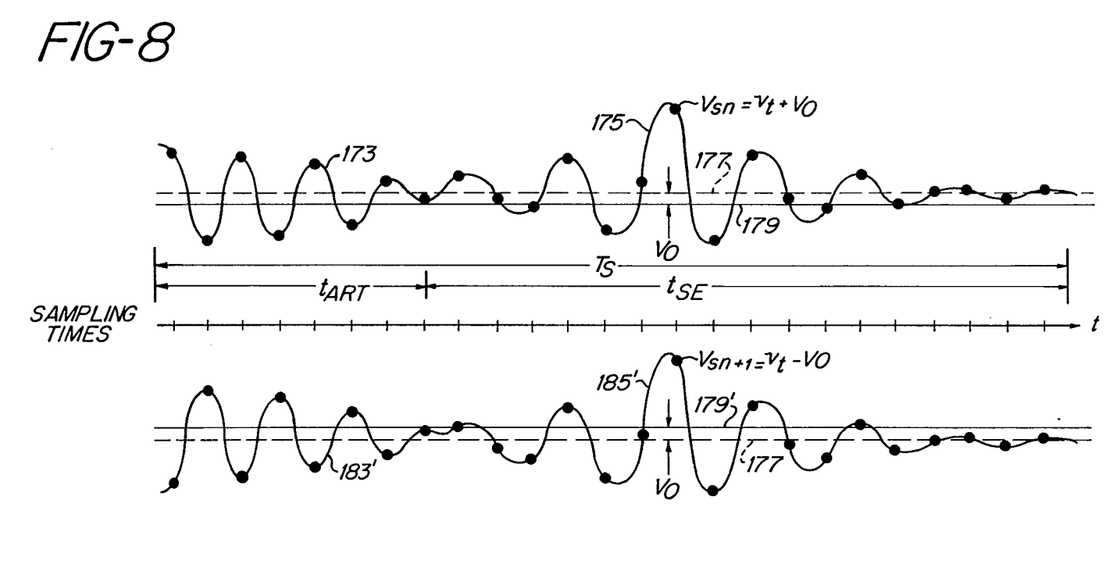
FIG. 8 represents the effects of the 90° pulse phase alternation of FIG. 7.

A preferred technique in accordance with the principles of the present invention for removing artifacts from an NMR image, and for simultaneously eliminating the effects of D.C. offsets of the received signal, is illustrated in FIGS. 7 and 8. FIG. 7 is similar to FIG. 4, in that it shows two lines of image data acquisition using two-pulse sequences. The first line n includes a 90 degree pulse 170 which exhibits a phase $\phi$, followed by a 180 degree pulse 172. Free induction decay signals 171 and 173 are developed following each excitation pulse, and a spin-echo signal 175 is developed at time $\tau$ after the 180 degree pulse 172.

The second line n+1 in FIG. 7 includes a 90 degree pulse 180 which exhibits a phase $\phi+180°$. The 90 degree pulse 180 is followed by a 180 degree pulse 182. Free induction decay signals 181 and 183 are developed after each excitation pulse, and a spin-echo signal 185 is produced at time $\tau$ after the 180 degree pulse 182.

The alternate phasing of the 90 degree pulses from line to line phase modulates the unwanted free induction decay signals 173 and 183 and the spin-echo signals 175 and 185 in the following manner. The unwanted signals 173 and 183 are in phase at respective points in time following the 180 degree pulses from line to line. The spin-echo signals 175 and 185 are in respective phase opposition from line to line as shown in the FIGURE. In order to bring the spin-echo signals back into phase alignment, the reference phase of the receiver is alternated from line to line. This may be done electronically, for instance, by shifting the reference phase applied to phase detector 42 and 44 in FIG. 2 from line to line. During line n, for example, the phase detectors 42 and 44 receive 0° and 90° phase reference signals, and during line n+1 the phase detectors receive 180° and 270° phase reference signals. This phase alternation brings the spin-echo signals back into the same phase relationship during the sampling periods $T_s$, and also shifts the unwanted free induction decay signals into phase opposition from line to line. The signals are then sampled during the $T_s$ sampling periods, and the resulting data sets are subjected to Fourier transformation. As before, the Fourier transformation of the phase modulated artifact signals cause them to appear at the edge of the image, since their spectral location is at the limit of that employed in the Fourier transformation process.

The present inventors have found that it is preferential not to switch the phases of the phase detector reference signals, but to sample the signals and perform the phase shifting through software manipulation of the sampled data values in the computer 60. The software phase shifting is perfomed prior to Fourier transformation with the same result, and without the electronic complexity of electronic reference signal switching.

This technique of alternating the phase of the $\alpha$ (90 degree) pulse from line to line also results in the elimination of D.C. signal offsets. The dashed lines 177 in FIG. 7 indicate the true center line of the received signals. As the signals proceed through the receiver, the effects of signal coupling and biasing in the receiver electronics may cause the true center line of the signals to be offset from the D.C. reference level 179 by the time the signals are digitized. However, this technique of artifact removal also causes the undesired D.C. offset to be modulated from line to line and appear at the edge of the image, provided that the offset is substantially constant during acquisition of the image.

This effect is representatively shown by the waveforms of FIG. 8, which shows line n and line n+1 signal waveforms referenced to a common sampling period $T_s$. The dots on the waveform indicate sampling times. The upper waveform is comprised of artifact signal 173 most visible during time segment $t_{ART}$, and spin-echo signal 175 during time segment $t_{SE}$. For ease of illustration the two signal segments are shown as being monotonal, although it is recognized that in an actual embodiment the signal during time segment $t_{ART}$ will be a complex waveform of both the spin-echo and artifact signals. Also for ease of comparative illustration, the lower waveform comprised of artifact signal 183' and spin-echo signal 185' is shown inverted relative to waveforms 183 and 185 in FIG. 7; however, the illustrated effect is the same as that of phase shifting, as the signal in the preferred embodiment is software-inverted as it is passed to the memory of computer 60.

In FIG. 8, the waveforms of the respective lines are shown with true center lines 177 and D.C. reference levels 179 and 179'. The D.C. reference level 179' in the lower waveform is shown above the true center line 177 since the waveform is shown in inverted form. The inverted representation shows that the artifact components 173 and 183' are modulated in phase alternation from line to line for artifact removal.

Each sampled value in the line n waveform, $V_{Sn}$, has a value equal to the sum of the true center line signal level, $v_t$, and the D.C. offset, $V_o$. In the line n+1 waveform, each sampled value $V_{Sn+1}$ is equal to the true center line signal level $v_t$ minus the D.C. offset $V_o$. The sign of the D.C. offset is seen to alternate from line to line. Thus, the D.C. offset is phase modulated at the Nyquist frequency of the phase-encoded dimension, and Fourier transformation will cause the effects of the D.C. offset to be removed to the frequency spectrum limit at the edge of the NMR image.

What is claimed is:

1. In a nuclear magnetic resonance imaging system in which resultant NMR signals comprising desired NMR signals and undesired artifact signal components are collected by a two-pulse excitation sequence, including a source of gradient field signals for spatially encoding said NMR signals, apparatus comprising:

means for exciting an imaging subject during alternate lines of signal acquisition using a two-pulse excitation sequence and detecting resultant NMR signals during subsequent data collection periods during which undesired artifact signal components and desired NMR signals exhibit a first phase relationship;

means for exciting an imaging subject during the remaining lines of signal acquisition using a two-pulse excitation sequence and detecting resultant NMR signals during subsequent data collection periods during which undesired artifact signal components and desired NMR signals exhibit a second phase relationship;

means for performing a Fourier transformation of said lines of artifact signal and NMR signal information with said artifact signal components exhibiting a phasing which varies from line to line so as to form an NMR image in which the line rate phase variation of said artifact signal components results in the location of said artifact signal components away from the center of said NMR image when said resultant NMR signals are converted to a spatially representative frequency domain through Fourier transformation.

2. The nuclear magnetic resonance imaging system of claim 1, wherein said desired NMR signals are spin-echo signals and said artifact signal components are free decay signal components.

3. The nuclear magnetic resonance imaging system of claim 2, wherein the phasing of said artifact signal components varies from line to line and the phasing of said spin-echo signals is substantially the same from line to line except as a result of spatial encoding.

4. In a nuclear magnetic resonance imaging system, in which NMR signals are generated in response to a series of two-pulse excitation sequences, each sequence comprising an alpha pulse and a beta pulse, said excitation pulse sequences being accompanied by spatially encoding gradient field signals; apparatus comprising:

means for alternating the phase of said beta excitation pulse from n line excitation pulse sequence to n+1 line excitation sequence, whereby the phasing of free decay signals produced after each beta excitation pulse is alternated from n line excitation sequence to n+1 line excitation sequence;

means for detecting a desired NMR signal following each two-pulse sequence during a data collection period during which components of said free decay signals may also be present; and means for performing a Fourier transformation of said detected signals so as to form an image, said Fourier transformation being performed at least in the direction of phase alteration of said free decay signals to that the alternated phasing of said free decay signals from n line excitation sequence to n+1 line excitation sequence results, through Fourier transformation, in the location of said free decay signals away from the center of said image.

5. The nuclear magnetic resonance imaging system of claim 4, wherein said desired NMR signals are spin-echo signals, the phases of which are substantially unaffected from sequence to sequence in response to the alternating phase of said beta excitation pulse.

6. In a nuclear magnetic resonance imaging system, in which NMR signals are generated in response to a series of two-pulse excitation sequences, each sequence comprising an alpha pulse and a beta pulse, said excitation pulse sequences being accompanied by spatially encoding gradient field signals; apparatus comprising:

means for alternating the phase of said alpha excitation pulse from n line excitation pulse sequence to n+1 line excitation sequence, whereby the phasing of free decay signals produced after each beta excitation pulse is substantially the same in response to the phase alternation of said alpha pulse from n line excitation sequence to n+1 line excitation sequence, and the phasing of desired NMR signals produced after each beta pulse is alternated in response to the phase alternation of said alpha pulse from n line excitation sequence to n+1 line excitation sequence;

means for detecting said desired NMR signals following each two-pulse sequence during a data collection period during which components of said free decay signals may also be present, said detecting means including means for alternating the relative phasing of detected signals from n line excitation sequence to n+1 line excitation sequence; and means for performing a Fourier transformation of said detected signals so as to form an image, said Fourier transformation being performed at least in the direction of said phase alternation so that the alternating phasing of said free decay signals and any substantially constant DC signal offsets established by said means for alternating results, through Fourier transformation, in their removal from the center of the image.

7. The nuclear magnetic resonance imaging system of claim 6, wherein said desired NMR signals are spin-echo signals.

8. In a nuclear magnetic resonance imaging system, in which an image is formed by acquiring a plurality of sequences of line information in response to two-pulse excitation sequences, each of which produces an undesired free decay signal and a desired NMR signal; a method for reducing the effects of said undesired free decay signal components comprising the steps of:
   (a) controlling the phasing of said excitation pulse sequence so as to phase-encode detected free decay signal components with phasing which alternates from line to line; and
   (b) performing a Fourier transformation of said acquired line information so as to form an image, said Fourier transformation being performed in at least the direction of phase alternation of said detected free decay signal components so that the line to line alternation of the phasing of said free decay signal components results in their removal from the center of the image through Fourier transformation.

9. The method of claim 8, wherein step (a) comprises alternating the phase of the second pulse in said two-pulse sequences from one sequence to the next.

10. The method of claim 8, wherein step (a) comprises the steps of:
   (a1) alternating the phase of the first pulse in said two-pulse sequences from one sequence to the next; and
   (a2) alternating the phase of detected signals from one sequence to the next so as to phase-encode detected free decay signal components with phasing which alternates from line to line;
   whereby substantially constant DC signal offsets are also phase encoded so as to be removed from the center of said image through Fourier transformation.

11. In a nuclear magnetic resonance imaging system in which resultant NMR signals are collected by a two-pulse excitation sequence, said resultant NMR signals consisting of desired NMR signals which also may contain undesired artifact signal components; and including a source of gradient field signals for spatially encoding said NMR signals, apparatus comprising:
   means for exciting an imaging subject during alternate lines of signal acquisition using a two-pulse excitation sequence and detecting resultant NMR signals during subsequent data collection periods during which undesired artifact signal components and desired NMR signals exhibit a first phase relationship;
   means for exciting an imaging subject during the remaining lines of signal acquisition using a two-pulse excitation sequence and detecting resultant NMR signals during subsequent data collection periods during which undesired artifact signal components and desired NMR signals exhibit a second phase relationship;
   wherein the phasing of said artifact signal components resulting from said means for exciting is substantially the same from line to line and the phasing of said desired NMR signals alternates from line to line in addition to variations due to spatial encoding;
   means for inverting the phasing of alternate ones of said lines; and
   means for performing a Fourier transformation of said lines of artifact signal and NMR signal information so as to form an NMR image in which the phasing of said artifact signal components which alternates from line to line by operation of said means for inverting causes said artifact components to be located away from the center of said NMR image through Fourier transformation.

* * * * *